United States Patent [19]
Glance et al.

[11] Patent Number: 5,509,023
[45] Date of Patent: Apr. 16, 1996

[54] LASER CONTROL ARRANGEMENT FOR TUNING A LASER

[75] Inventors: Bernard Glance, Colts Neck; Ivan P. Kaminow, Holmdel, both of N.J.

[73] Assignee: AT&T Corp., Murray Hill, N.J.

[21] Appl. No.: 209,585

[22] Filed: Mar. 10, 1994

[51] Int. Cl.$^6$ ..................................................... H01S 3/10
[52] U.S. Cl. .................. 372/20; 372/6; 372/92; 372/32
[58] Field of Search ............................ 372/926; 378/20, 378/32; 385/24, 46, 37

[56] References Cited

U.S. PATENT DOCUMENTS

| | | | |
|---|---|---|---|
| 4,468,773 | 8/1984 | Seaton | 372/32 |
| 4,904,042 | 2/1990 | Dragone | 385/46 |
| 4,914,666 | 4/1990 | Glance | 372/20 |
| 5,002,350 | 3/1991 | Dragone | 385/24 |
| 5,136,671 | 8/1992 | Dragone | 385/46 |
| 5,204,640 | 4/1993 | Logan, Jr. | 372/32 |
| 5,243,672 | 9/1993 | Dragone | 385/46 |
| 5,339,157 | 8/1994 | Glance et al. | 385/24 |
| 5,373,517 | 12/1994 | Dragone et al. | 372/20 |

FOREIGN PATENT DOCUMENTS

| | | | |
|---|---|---|---|
| 63-179587 | 7/2388 | Japan | H01S 3/133 |

Primary Examiner—Leon Scott, Jr.
Attorney, Agent, or Firm—Stuart H. Mayer

[57] ABSTRACT

In a laser control arrangement for tuning a laser a portion of the optical signal exiting a resonator is directed to the input of an optical frequency routing device. The routing device has a plurality of outputs each for receiving one of the frequencies supplied by the laser. Each output is coupled to a photodetector. When the laser emits a frequency of light corresponding to one of the resonant frequencies of the resonator, the resonant frequency will appear on one of the outputs of the routing device and will be detected by the photodetector coupled to that output.

5 Claims, 3 Drawing Sheets

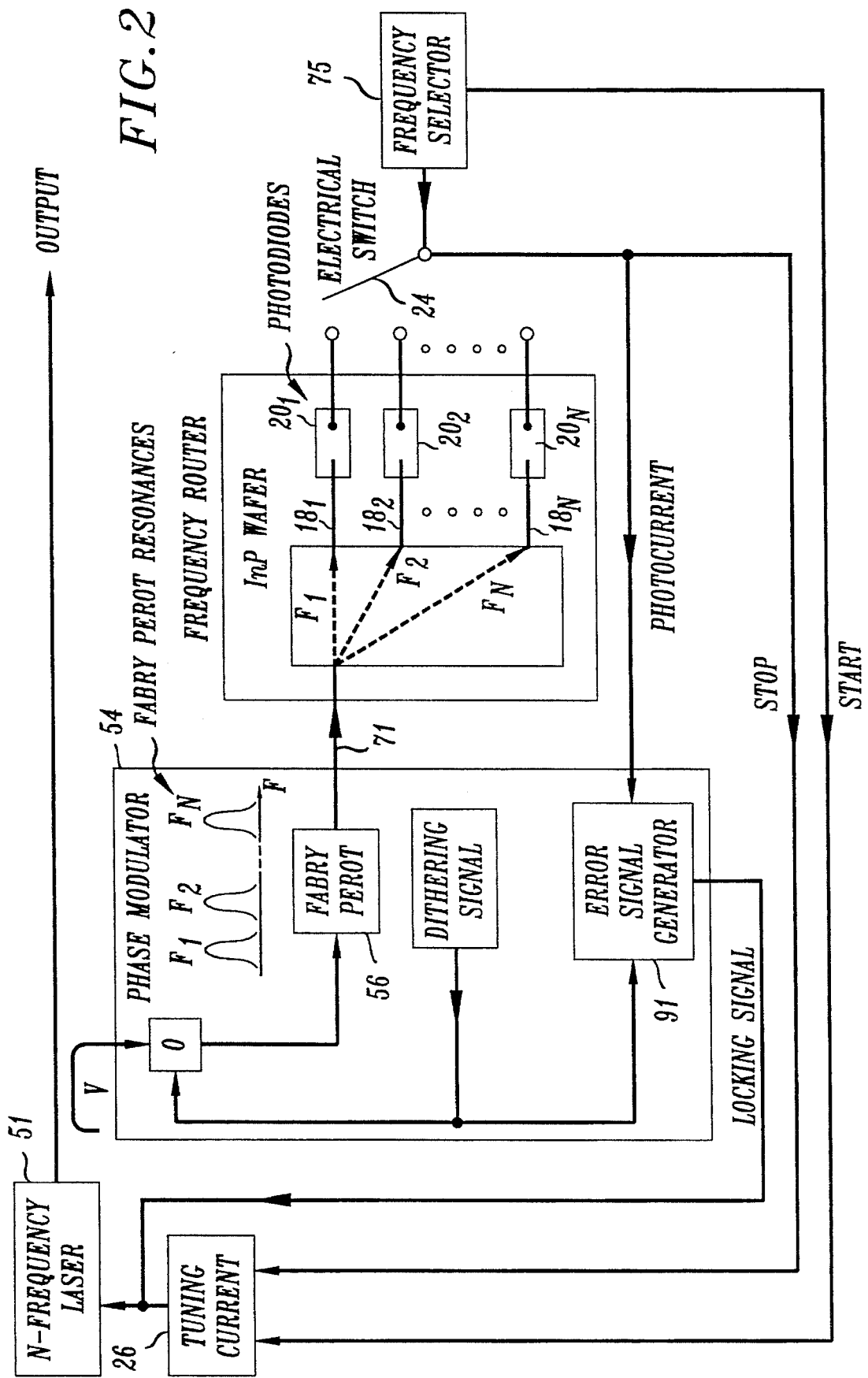

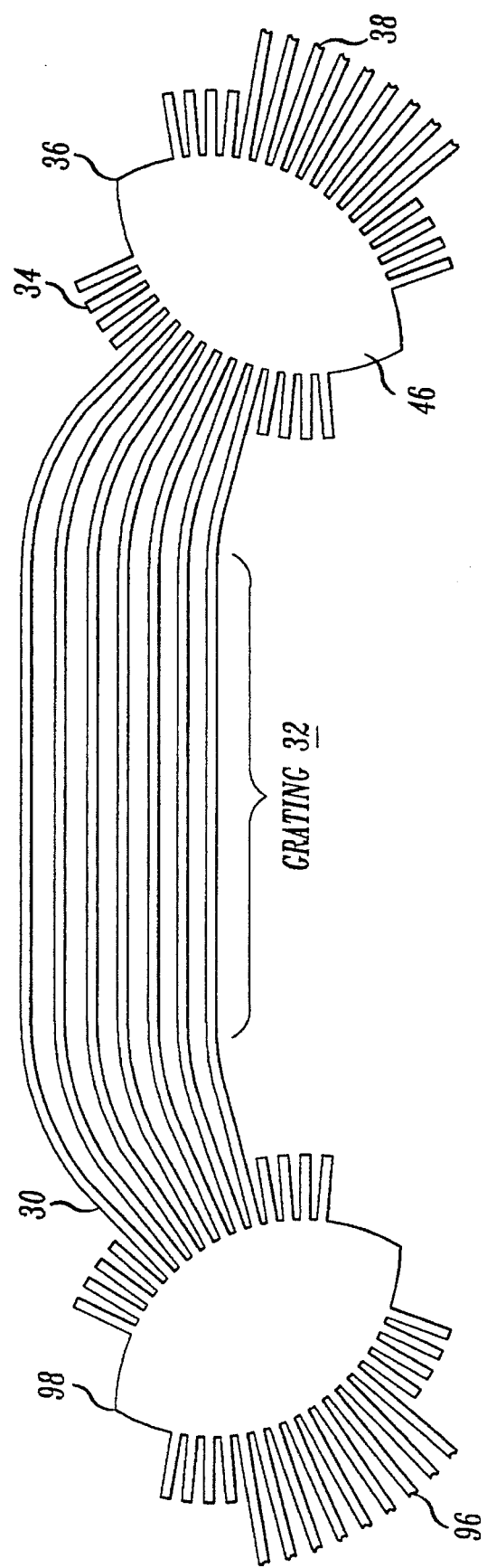

LASER CONTROL ARRANGEMENT FOR TUNING A LASER

TECHNICAL FIELD

This invention relates to optical communications systems. More particularly, this invention relates to a control arrangement for tuning a laser used in optical communications systems.

BACKGROUND OF THE INVENTION

There are known arrangements for tuning a laser to operate at selected frequencies throughout a wide range of frequencies. Frequency-tunable semiconductor lasers are attractive devices for optical frequency division multiplex transmission systems. In a tunable arrangement, a distributed Bragg reflection laser provides a large tuning range when different values of injection or bias current are injected into the phase control and the distributed Bragg reflector regions of the laser.

A known laser control arrangement is disclosed, for example, in U.S. Pat. No. 4,914,666, which is hereby incorporated by reference. This arrangement includes a laser tunable in response to different values of a control signal. A digital processor determines control signal values which produce different operating frequencies. The exact operating frequencies are defined by the resonances of a Fabry-Perot resonator. The control signal values are stored in the digital processor for ready retrieval. During operation, one of the control signal values, representing a desired operating frequency, is retrieved from storage and is applied to the single frequency laser to lock the laser at one of the resonances of the Fabry-Perot resonator. If the laser characteristic curve (i.e., laser frequency as a function of bias current) has drifted, a control signal error is determined by a control circuit part of the feedback loop and is added to the retrieved control signal value. The digital processor measures the value of the control signal error and derives a new total control signal value that is stored in place of the originally retrieved control signal value.

One limitation of the laser control arrangement described above is that there is no provision for determining the Fabry-Perot resonant frequency to which the laser is being locked without using an external measuring device such as an optical frequency meter.

SUMMARY OF THE INVENTION

In accordance with this invention, a laser control arrangement for tuning a laser has been developed in which the particular resonant frequency of the resonator that is employed to lock the laser can be selected by the user.

In one example of the invention, a portion of the optical signal exiting the resonator is directed to the input of an optical frequency routing device. The routing device has a plurality of outputs each for receiving one of the frequencies supplied by the laser. Each output is coupled to a photodetector. When the laser emits a frequency of light corresponding to one of the resonant frequencies of the resonator, the resonant frequency will appear on one of the outputs of the routing device and will be detected by the photodetector coupled to that output.

A switch may be provided so that the user can select a desired laser frequency from among the resonant frequencies of the resonator. A frequency selector is used to selectively couple the switch to the photodetector which corresponds to the desired resonant frequency. A locking circuit is also provided for receiving an electrical signal from the photodetectors to lock the laser frequency at the desired resonant frequency that is selected.

This is only an example of the invention. The full scope of the invention entitled to an exclusionary right is set forth in the claims at the end of this application.

BRIEF DESCRIPTION OF THE DRAWINGS

FIG. 2 is a block diagram of an example of the laser control arrangement in accordance with this invention.

FIG. 3 is a diagram illustrating the details of the optical frequency routing device shown in FIG. 2.

DETAILED DESCRIPTION

Figure 1:
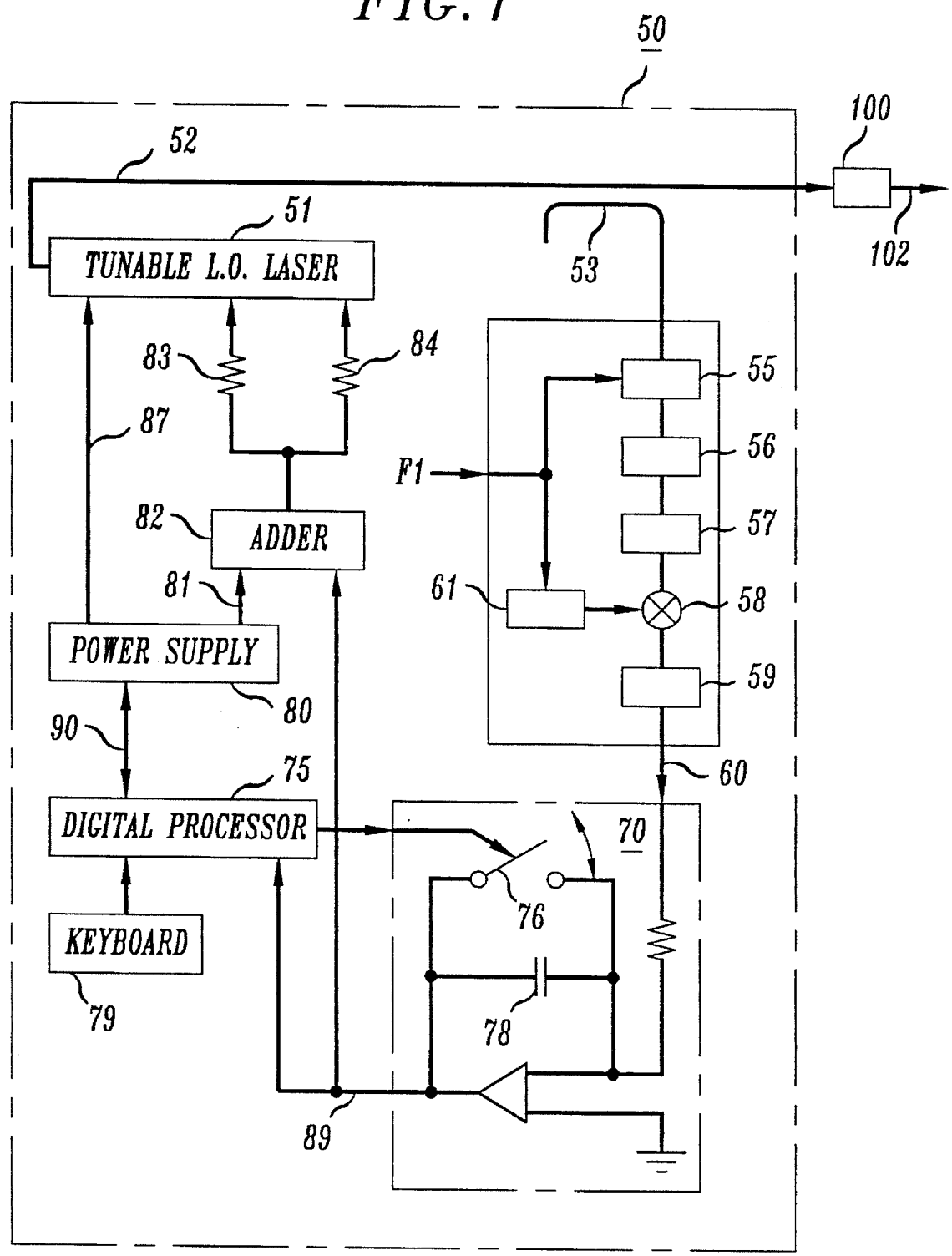
FIG. 1 is a block diagram of a known laser control arrangement for tuning a laser.

An example of a laser control arrangement 50 for tuning a laser to a desired resonant frequency selected from a range of frequencies is shown in FIG. 1. The desired frequencies coincide with the resonant frequencies of a Fabry-Perot resonator 56. Details of the laser control arrangement are disclosed in U.S. Pat. No. 4,914,666, referenced above. Briefly, the control arrangement 50 includes a distributed Bragg reflector laser 51 which produces a tunable single frequency output signal that is coupled into an optical fiber or guide 52. An optical coupler 53 taps a fraction of the optical signal from the guide 52 to be applied to an opto-electronic arrangement 54 that includes the Fabry-Perot resonator 56. The opto-electronic arrangement 54 generates an error signal on lead 60 that is used by a locking circuit for locking the laser oscillator frequency to the desired operating frequency.

The locking circuit employs a digital processor 75 for determining bias current values which produce the desired different operating frequencies corresponding to the set of Fabry-Perot resonant frequencies. Those current values are stored in the digital processor 75 for ready retrieval. During operation, one of the bias current values is retrieved and applied to the laser. If the laser characteristic curve has drifted, an incremental bias current is generated by an integrator 70 in response to the error signal 60 and is added to the retrieved bias current value. The resulting total laser bias current drives the laser 51 to oscillate at the desired Fabry-Perot resonant frequency.

One limitation of the laser control arrangement described above is that there is no way to determine the Fabry-Perot resonant frequency to which the laser is being locked without using an external measuring device such as an optical frequency meter. Such a measurement is necessary because the laser control arrangement does not provide any means to determine which particular Fabry-Perot resonance is being used to lock the laser.

FIG. 2 shows a simplified schematic diagram of a laser control arrangement similar to that shown in FIG. 1 in which an optical frequency routing device is used to unambiguously determine the particular Fabry-Perot resonant frequency to which the laser is tuned. In this arrangement a fraction of the optical signal exiting the Fabry-Perot resonator 56 is directed to the input 71 of an optical frequency routing device 72. The frequency routing device 72 directs different frequencies applied to its input to different ones of its output waveguides $18_1, 18_2, \ldots, 18_N$.

The output waveguides $18_1, 18_2, \ldots, 18_N$ are respectively coupled to photodetectors $20_1, 20_2, \ldots, 20_N$, which in one example of the invention are photodiodes. The photodiodes may be formed from optically active sections of the waveguides and may be monolithicaly integrated with the frequency routing device on a single semiconductor wafer. The photodetectors $20_1, 20_2, \ldots, 20_N$ convert the detected optical signals into electrical signals. An electric switch 24 is connected to selectively enable the photodetectors to direct the control signal to a locking circuit. In operation, at any given time only one photodetector is coupled to the locking circuit via the switch 24 and hence only one electrical signal, which corresponds to one optical frequency, is transmitted to the locking circuit at any given time.

A frequency selector 75 is used to selectively adjust the electronic switch so that it is coupled to a preselected one of the photodetectors $20_1, 20_2, \ldots, 20_N$. The frequency selector 75 is also coupled to a power supply 26, which forms a part of the locking circuit, for supplying the tuning current to the laser. The frequency selector activates the power supply 26 so that tuning current is applied to the laser. The tuning current is varied until the laser frequency corresponds to the Fabry-Perot resonant mode that was preselected by coupling the switch 24 to the photodetector associated with that mode. Once this tuning current is achieved, a photocurrent from the photodiode activates the locking circuit so that the laser frequency is locked at that Fabry-Perot resonant mode. In the example of the invention shown in FIG. 2, the photocurrent is directed to an error signal generator 91 which forms a part of the electro-optic arrangement 54. The error signal generator 91 then produces the locking signal to lock the laser frequency. Additional details of one example of a locking circuit that may be employed with the tuning arrangement of the present invention is disclosed in U.S. Pat. No. 4,914,666 referenced above.

FIG. 3 shows the pertinent details of the frequency routing device employed in the invention. The frequency routing device contains a plurality of input waveguides 96 connected to a free space region 98. A plurality of output waveguides 30 extends from the free space region 98 and is connected to an optical grating 32. The optical grating 32 comprises a plurality of unequal length waveguides which provides a predetermined amount of path length difference to a corresponding plurality of input waveguides 34 connected to another free space region 46. The free space region 36 is connected to a plurality of output waveguides 38. These frequency routing devices operate as multiplexers and demultiplexers of optical frequencies. The details of their construction and operation are more fully described in U.S. Pat. No. 5,136,671 to Dragone. In the case of the frequency routing device 72 seen in FIG. 2, the input waveguide 71 corresponds to one of the input waveguides 96 shown in FIG. 3 and the output waveguides $20_1, 20_2, \ldots, 20_N$ correspond to the output waveguides 38 shown in FIG. 3. When employed in the present invention, the frequency routing device 72 should be configured to have its passband centers aligned with the resonances of the Fabry-Perot resonator 56.

We claim:

1. A laser control arrangement for tuning a laser comprising:

a resonator configured to support a plurality of resonant frequencies;

a laser for generating optical energy oscillating at a desired resonant frequency selected from among the plurality of resonant frequencies of the resonator, said laser being tunable via a control signal that determines a value of bias current applied to the laser;

an optical coupler coupling a portion of the optical energy generated by the laser to the resonator;

means for selecting the desired resonant frequency from among the plurality of resonant frequencies of the resonator; and means for locking the laser frequency of the laser at the desired resonant frequency.

2. The laser control arrangement of claim 1 wherein the selecting means comprises: an optical frequency routing device having an input optically coupled to the resonator and a plurality of outputs forming a plurality of frequency selective pathways with said input, each of said frequency selective pathways transmitting a frequency equal to one of said resonant frequencies of the resonator; a plurality of photodetectors optically coupled to the plurality of outputs for detecting the frequency transmitted by the frequency routing device.

3. The laser control arrangement of claim 2 wherein the selecting means further comprises a switch and a frequency selector for selectively coupling the switch to one of the plurality of photodetectors so that said locking means locks said laser to the frequency detected by the photodetector coupled to the switch.

4. The laser control arrangement of claim 3 wherein the locking means comprises means for generating the control signal to drive the laser at the desired resonant frequency.

5. The laser control arrangement of claim 2, wherein the optical frequency routing device comprises:

a plurality of input waveguides;

a first free space region connected to the plurality of input waveguides;

a plurality of output waveguides connected to the first free space region;

an optical grating connected to the plurality of output waveguides comprising a plurality of unequal length waveguides;

a plurality of input waveguides connected to the optical grating;

a second free space region connected to the plurality of input waveguides connected to the optical grating; and at least one output waveguide connected to the second free space region.

* * * * *